(12) United States Patent
Koo

(10) Patent No.: US 7,391,660 B2
(45) Date of Patent: Jun. 24, 2008

(54) ADDRESS PATH CIRCUIT WITH ROW REDUNDANT SCHEME

(75) Inventor: Cheul Hee Koo, Icheon-Si (KR)

(73) Assignee: Hynix Semiconductor Inc., Gyunngi-do (KR)

(*) Notice: Subject to any disclaimer, the term of this patent is extended or adjusted under 35 U.S.C. 154(b) by 175 days.

(21) Appl. No.: 11/458,235

(22) Filed: Jul. 18, 2006

(65) Prior Publication Data
US 2007/0081413 A1   Apr. 12, 2007

(30) Foreign Application Priority Data
Oct. 12, 2005   (KR) ...................... 10-2005-0096253

(51) Int. Cl.
*G11C 29/00* (2006.01)
*G11C 7/00* (2006.01)

(52) U.S. Cl. ............... 365/200; 365/230.03; 365/230.06

(58) Field of Classification Search ................. 365/200, 365/230.03, 230.06
See application file for complete search history.

(56) References Cited

U.S. PATENT DOCUMENTS

| | | | |
|---|---|---|---|
| 5,852,580 A | 12/1998 | Ha | |
| 6,167,540 A | 12/2000 | Azuma | |
| 6,411,558 B1 | 6/2002 | Tanaka | |
| 6,459,631 B2 * | 10/2002 | Fischer et al. | ............... 365/200 |
| 7,184,330 B2 * | 2/2007 | Tajima et al. | ............... 365/200 |
| 2004/0218433 A1 | 11/2004 | Kang | |

FOREIGN PATENT DOCUMENTS

| | | |
|---|---|---|
| JP | 10-208495 | 8/1998 |
| JP | 11-249969 | 9/1999 |
| JP | 2001-210091 | 8/2001 |

* cited by examiner

*Primary Examiner*—VanThu Nguyen
(74) *Attorney, Agent, or Firm*—Marshall, Gerstein & Borun LLP

(57) ABSTRACT

An address path circuit with a row redundant scheme may include an address buffer for buffering an external address to output an internal address, a command buffer for buffering a plurality of external commands, a pre-latch unit for pre-latching the internal address from the address buffer using a specific one of the commands buffered by the command buffer to output a pre-latched internal address, a detector for detecting whether the pre-latched internal address from the pre-latch unit is a repaired address or normal address and outputting one or more detection signals as a result of the detection, an address latch unit for latching the internal address from the address buffer synchronously with a buffered clock to output a latched internal address, and a global address generator for receiving the detection signals from the detector and the latched internal address from the address latch unit and generating a global row address.

18 Claims, 5 Drawing Sheets

ADDRESS PATH CIRCUIT WITH ROW REDUNDANT SCHEME

TECHNICAL FIELD

This patent relates to an address path circuit with a row redundant scheme, and more particularly to an address path circuit wherein a detector, which detects whether an address inputted through an address buffer is a repaired address or normal address, is installed in a peri-area, not in each bank, thereby making it possible to reduce the chip area of a semiconductor device and improve the operating speed thereof.

DESCRIPTION OF THE RELATED ART

Generally, in a semiconductor device, if a defect occurs in cells of a cell array, a redundancy circuit is used to repair the defect. That is, when a cell, connected to a specific word line or bit line of a cell array in which data is stored, fails due to various factors, it may lose its data storage capability or make reading or writing of data therefrom or thereinto impossible. At this time, the failed cell on the specific word line or bit line is replaced with a redundant cell on a redundant word line or bit line.

In this connection, an address path circuit of the semiconductor device is adapted to detect whether an externally inputted address is a normal address or repaired address and output a signal for selection of a normal main word line or redundant main word line as a result of the detection. However, such a conventional address path circuit with a row redundant scheme has a disadvantage in that a detector, which detects whether an externally inputted address is a normal address or repaired address, is installed in each bank of a core area, causing an increase in the chip area of the semiconductor device and an obstacle to improvement in the operating speed of the semiconductor device. This problem with the conventional address path circuit with the row redundant scheme will hereinafter be described in detail with reference to FIG. 1.

FIG. I shows the configuration of the conventional address path circuit.

First, an external clock CLK, an external address an, and external commands RAS, CAS, WE and CS are buffered by a clock buffer 105, address buffer 110, and command buffer 115, respectively. Then, an address latch unit 120 latches an internal address add from the address buffer 110 synchronously with an internal clock iCLK from the clock buffer 105 to output a latched internal address at. Meanwhile, a command decoder 130 receives at least one of the commands buffered by the command buffer 115 and outputs a row-decoded signal rowp6.

A global address generator 140 receives the latched internal address at from the address latch unit 120 and the row-decoded signal rowp6 from the command decoder 130 and generates a global address gax to be sent over a global address line. A control circuit 150 receives the row-decoded signal rowp6 and a bank address ba and outputs a row access strobe signal Ratvzp13.

A local address generator 160 latches the global address gax from the global address generator 140 synchronously with the row access strobe signal Ratvzp13 from the control circuit 150 to output a local row address bax which is valid for each bank. A detector 170, which includes fuse circuits, detects whether the local row address bax from the local address generator 160 is a normal row address or repaired row address and provides information about the detection to a decoder 180. Finally, the decoder 180 outputs a normal main word line signal mwlz if the detection information from the detector 170 indicates that the local row address bax is the normal row address, and a redundant main word line signal rmwlz if the detection information indicates that the local row address bax is the repaired row address.

As mentioned above, in the conventional address path circuit, the detector, which detects whether an externally inputted address is a normal address or repaired address, is installed in each bank of a core area, so the semiconductor device must be increased in chip area to accommodate the detector in each bank. In addition, until the detection information is generated by the detector 170 including the fuse circuits, a normal main word line cannot be selected, resulting in an obstacle to improvement in the operating speed of the semiconductor device.

SUMMARY OF THE INVENTION

An address path circuit wherein a detector, which detects whether an address inputted through an address buffer is a repaired address or normal address, is installed in a peri-area, not in each bank, thereby making it possible to reduce the chip area of a semiconductor device and improve the operating speed thereof.

An address path circuit with a row redundant scheme may include an address buffer for buffering an external address to output an internal address; a command buffer for buffering a plurality of external commands; a pre-latch unit for pre-latching the internal address from the address buffer using a specific one of the commands buffered by the command buffer to output a pre-latched internal address; a detector for detecting whether the pre-latched internal address from the pre-latch unit is a repaired address or normal address and outputting one or more detection signals as a result of the detection; an address latch unit for latching the internal address from the address buffer synchronously with a buffered clock to output a latched internal address; and a global address generator for receiving the detection signals from the detector and the latched internal address from the address latch unit and generating a global row address, the global address generator outputting the latched internal address from the address latch unit as the global row address when the detection result of the detector indicates that the pre-latched internal address from the pre-latch unit is the normal address, and an encoded address obtained by encoding the detection signals as the global row address when the detection result of the detector indicates that the pre-latched internal address is the repaired address.

The address path circuit may further include: a local address generator for latching the global row address synchronously with a row access strobe signal to output a local row address which is valid for each bank; and a decoder for decoding the local row address to output a normal main word line signal corresponding to the normal address or a redundant main word line signal corresponding to the repaired address.

The decoder may include a first decoder for decoding the local row address to output the normal main word line signal corresponding to the normal address; and a second decoder for decoding the local row address to output the redundant main word line signal corresponding to the repaired address.

The pre-latch unit may pre-latch the internal address from the address buffer using a row address strobe (RAS) signal buffered by the command buffer.

The pre-latch unit may include a first delay for delaying the internal address from the address buffer by a first period; a second delay for delaying the buffered RAS signal by a second period; and a latch element for latching an output signal from the first delay synchronously with a point of time that an output signal from the second delay is enabled The latch element may be a flip-flip, the flip-flop latching the output signal from the first delay synchronously with the point of time that the output signal from the second delay is enabled, to hold the output signal from the first delay until a next point of time that the output signal from the second delay is enabled.

The detector may include a decoder for decoding the pre-latched internal address from the pre-latch unit to output a plurality of decoded signals; and one or more detection circuits, each of the detection circuits detecting, on the basis of the decoded signals from the decoder, whether the pre-latched internal address is the repaired address or normal address.

Each of the detection circuits may include precharge means for precharging a first node in response to a precharge signal; a plurality of pull-down devices for pulling the first node down in response to the decoded signals, respectively; and a plurality of fuses installed between the pull-down devices and the first node, respectively.

Each of the detection circuits may further include a latch for holding the first node at a desired voltage level.

The fuses may be selectively cut to constitute a combination thereof corresponding to a redundant cell address.

Each of the detection circuits may further include a plurality of switches installed between predefined groups of the pull-down devices and a ground terminal, respectively, the switches enabling a corresponding one of the detection circuits in response to a bank active signal.

The global address generator may include a logic circuit for performing a logic operation with respect to the detection signals from the detector; an encoder for encoding the detection signals from the detector to output the encoded address; a first signal transfer unit for transferring the latched internal address from the address latch unit in response to an output signal from the logic circuit; and a second signal transfer unit for transferring the encoded address from the encoder in response to the output signal from the logic circuit.

The logic circuit may output a gate control signal which is enabled when at least one of the detection signals is enabled.

The logic circuit may perform an OR operation.

The logic circuit may include a plurality of NOR gates, each of the NOR gates performing a NOR operation with respect to corresponding ones of the detection signals; and a NAND gate for performing a NAND operation with respect to output signals from the NOR gates.

The global address generator may further include an address latch element for latching the latched internal address from the address latch unit and then supplying it to the first signal transfer unit.

The first signal transfer unit and second signal transfer unit may be transfer gates which are turned on/off in response to the output signal from the logic circuit.

The global address generator may further include a latch for latching an output signal from the first signal transfer unit or second signal transfer unit; and a buffer for buffering an output signal from the latch.

BRIEF DESCRIPTION OF THE DRAWINGS

The above features and other advantages will be more clearly understood from the following detailed description taken in conjunction with the accompanying drawings, in which.

DESCRIPTION OF THE PREFERRED EMBODIMENTS

Figure 1:
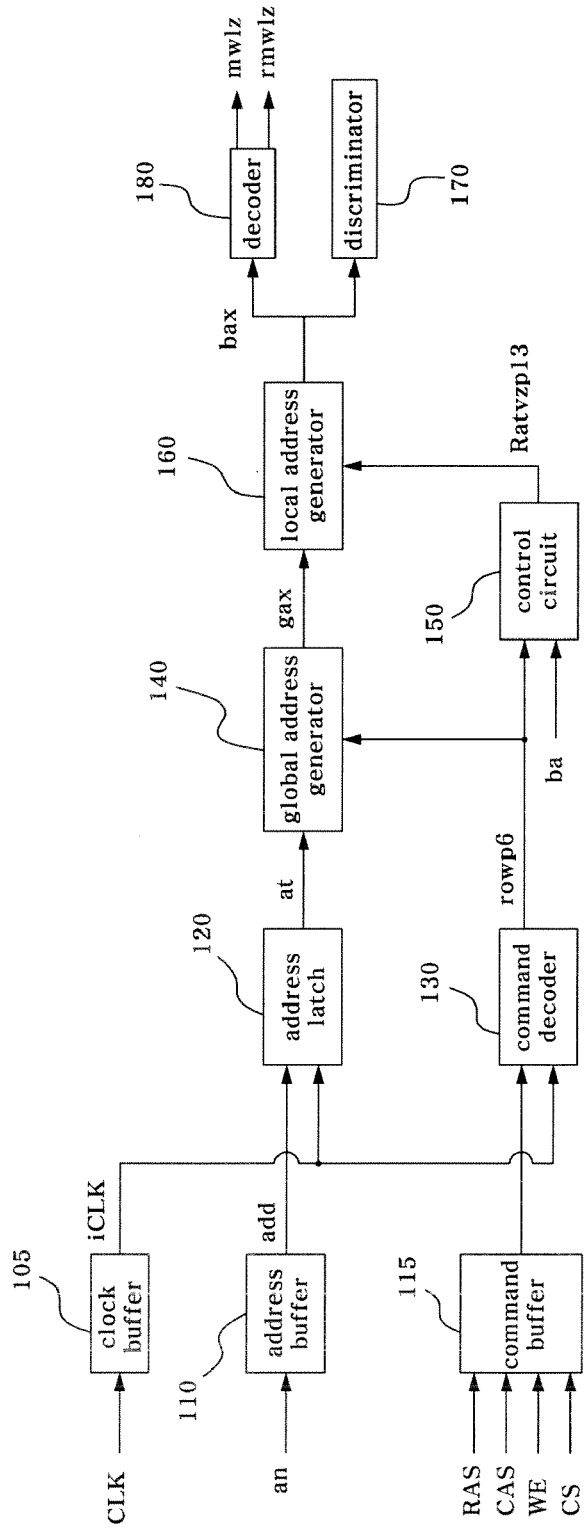
FIG. 1 is a block diagram showing the configuration of a conventional address path circuit.

Reference will now be made in detail to exemplary embodiments examples of which are illustrated in the accompanying drawings, wherein like reference numerals refer to like elements throughout. The embodiments are described with reference to the figures.

Figure 2:
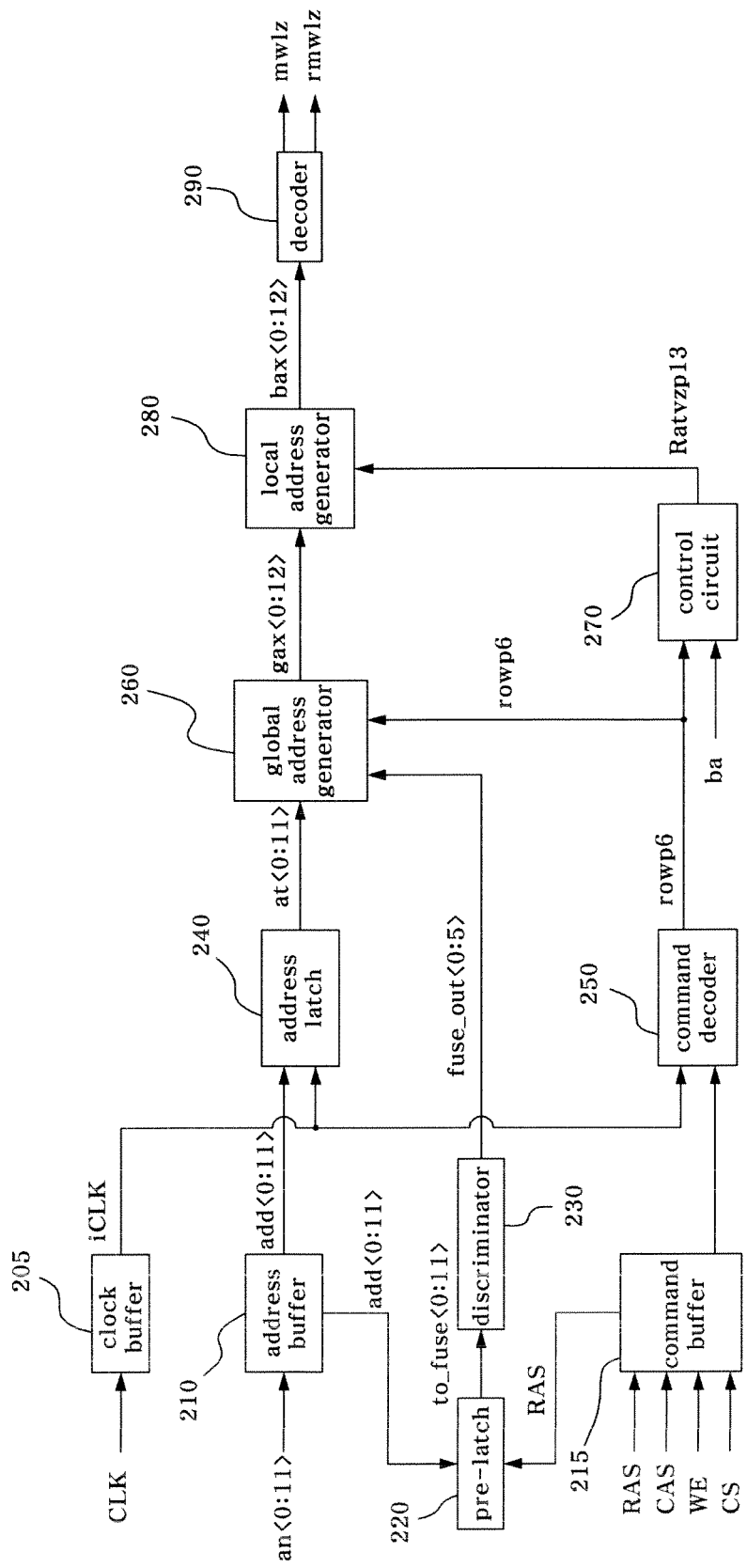
FIG. 2 is a block diagram showing the configuration of an address path circuit with a row redundant scheme according to an exemplary embodiment.
Figure 3:
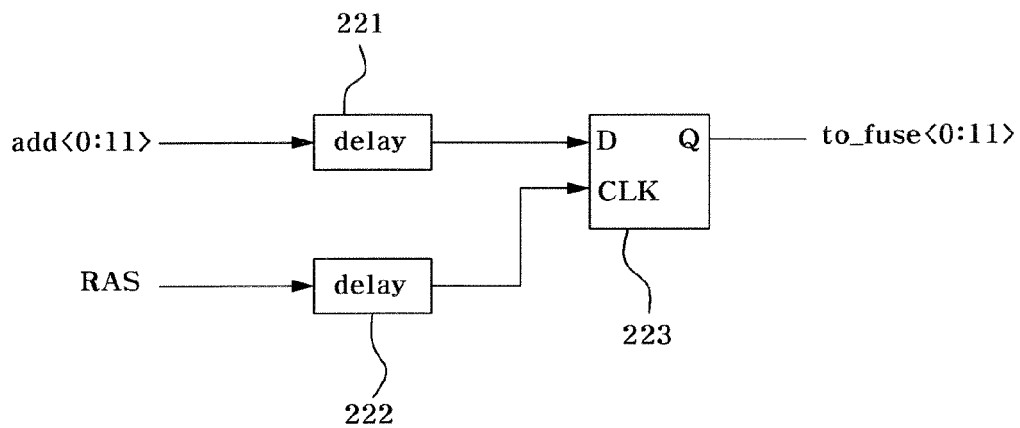
FIG. 3 is a block diagram of a pre-latch unit in the address path circuit with the row redundant scheme according to this embodiment.
Figure 4A:
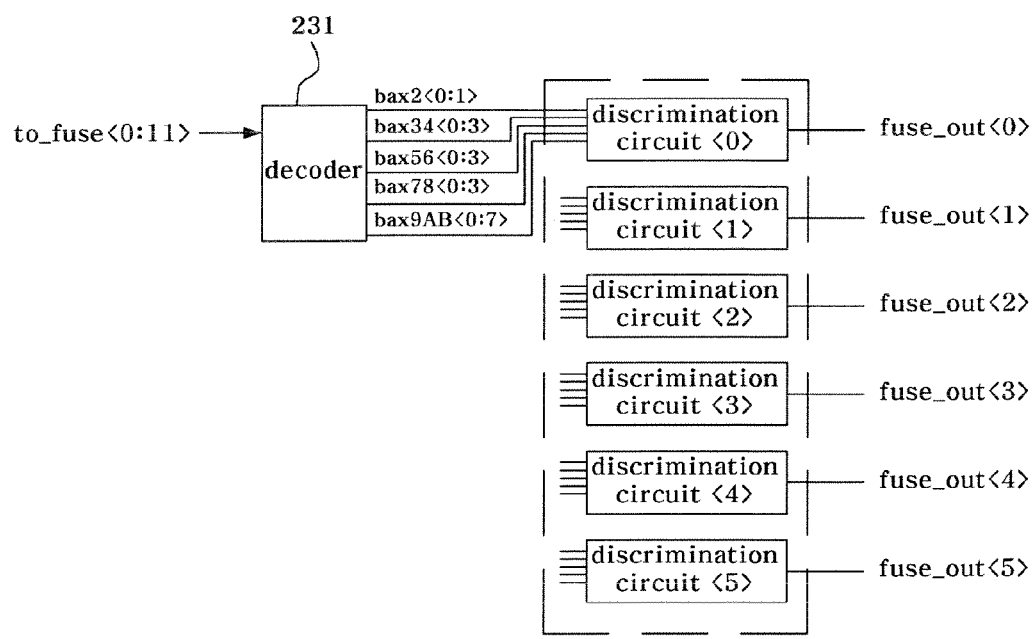
FIG. 4A is a block diagram of a detector in the address path circuit with the row redundant scheme according to this embodiment.
Figure 4B:
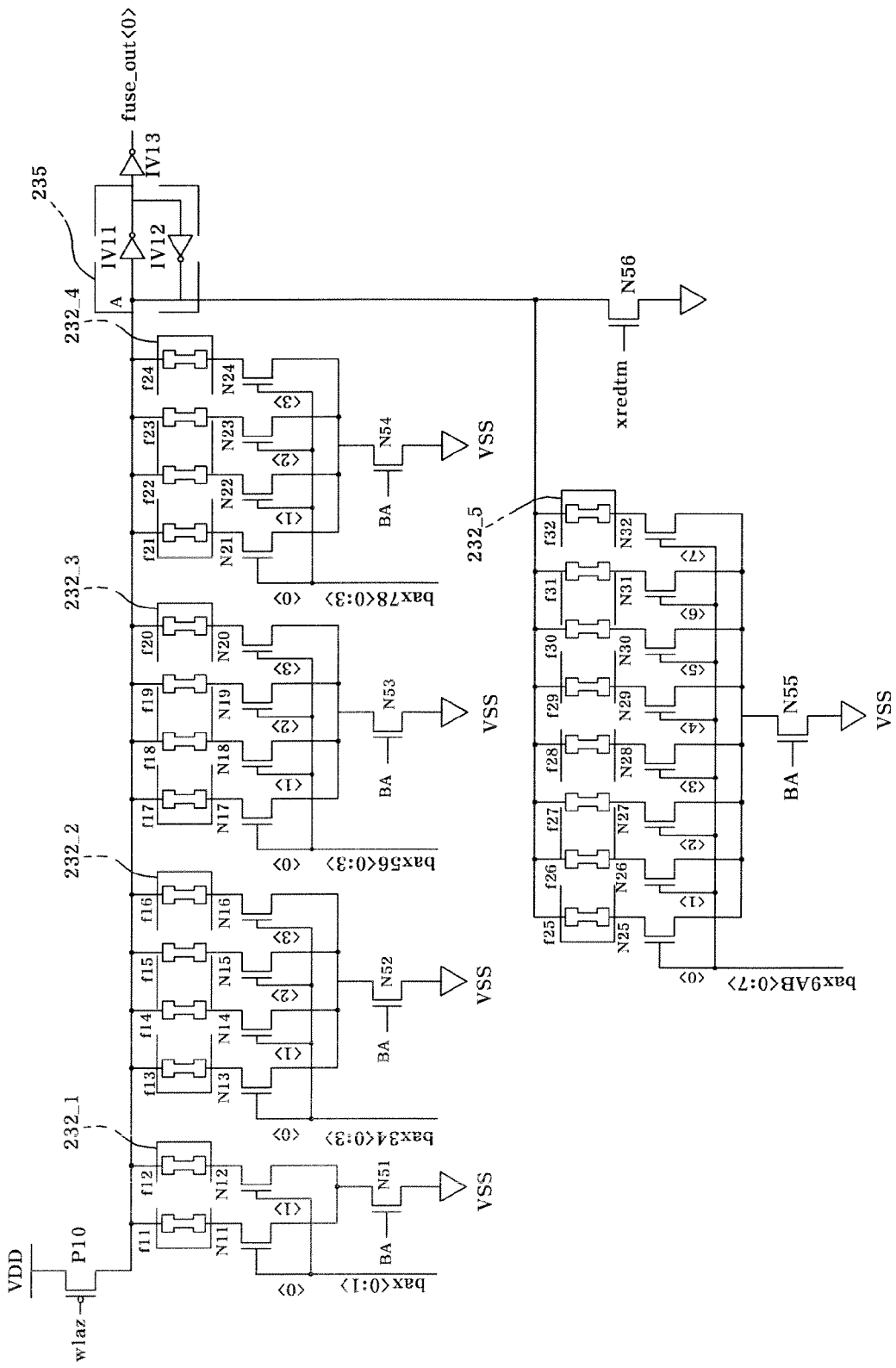
FIG. 4B is a circuit diagram of a detection circuit in the detector of FIG. 4A.
Figure 5:
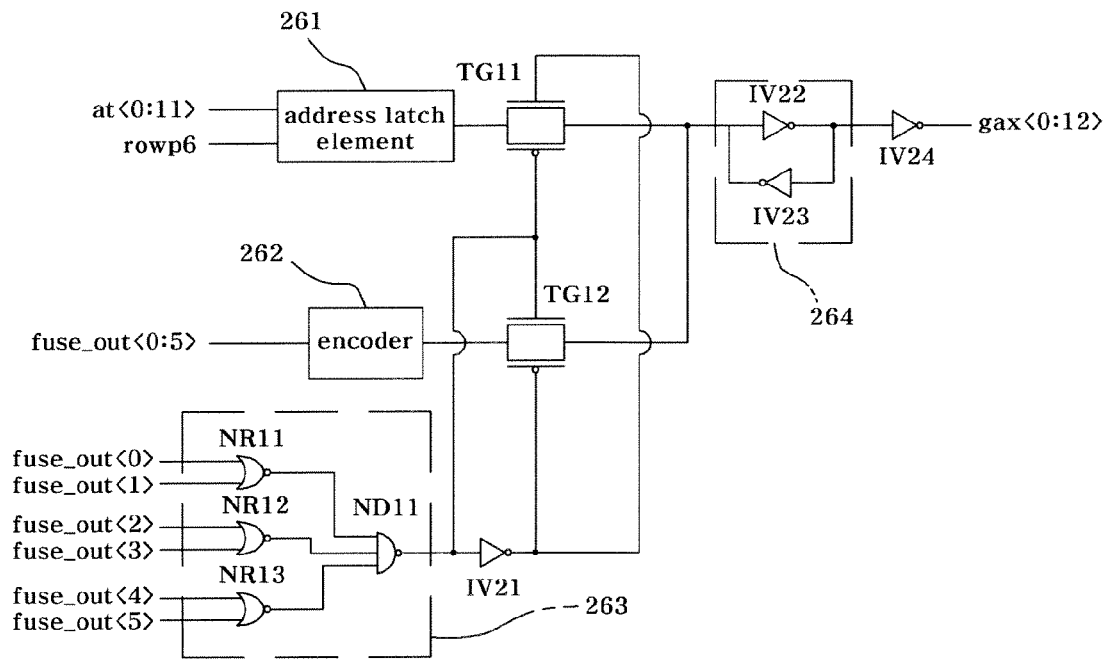
FIG. 5 is a circuit diagram of a global address generator in the address path circuit with the row redundant scheme according to this embodiment.
Figure 6:
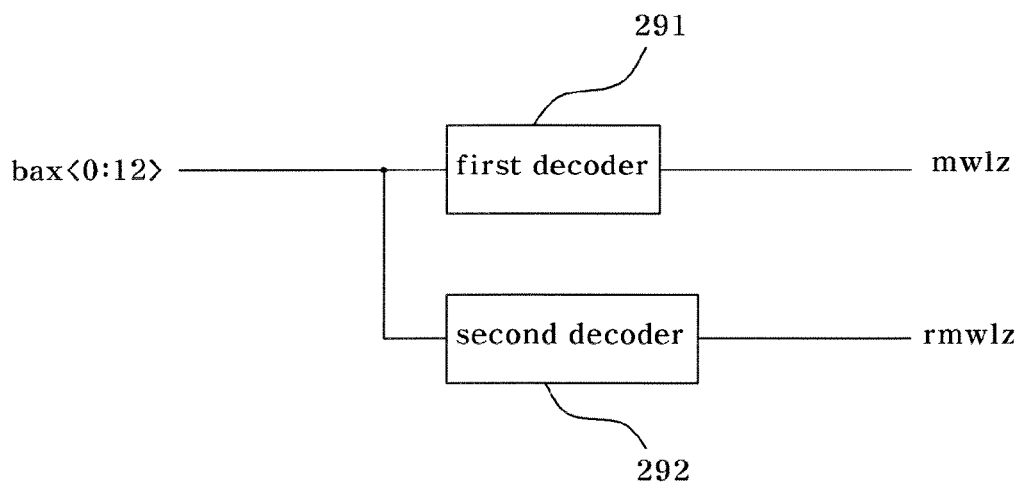
FIG. 6 is a block diagram of a decoder in the address path circuit with the row redundant scheme according to this embodiment.

FIG. 2 is a block diagram showing the configuration of an address path circuit with a row redundant scheme according to an exemplary embodiment, FIG. 3 is a block diagram of a pre-latch unit in the address path circuit with the row redundant scheme according to this embodiment, FIG. 4A is a block diagram of a detector in the address path circuit with the row redundant scheme according to this embodiment, FIG. 4B is a circuit diagram of a detection circuit in the detector of FIG. 4A, FIG. 5 is a circuit diagram of a global address generator in the address path circuit with the row redundant scheme according to this embodiment, and FIG. 6 is a block diagram of a decoder in the address path circuit with the row redundant scheme according to this embodiment.

As shown in FIG. 2, the address path circuit may include an address buffer 210 for buffering an external address an<0:11> to output an internal address add<0:11>, a command buffer 215 for buffering a plurality of external commands RAS, CAS, WE and CS, a pre-latch unit 220 for pre-latching the internal address add<0:11> from the address buffer 210 using a specific one of the commands buffered by the command buffer 215 to output a pre-latched internal address to_fuse<0:11>, a detector 230 for detecting whether the pre-latched internal address to_fuse<0:11> from the pre-latch unit 220 is a repaired address or normal address and outputting one or more detection signals fuse_out<0:5> as a result of the detection, an address latch unit 240 for latching the internal address add<0:11> from the address buffer 210 synchronously with a buffered clock iCLK to output a latched internal address at<0:11>, and a global address generator 260 for receiving the detection signals fuse_out<0:5> from the detector 230 and the latched internal address at<0:11> from the address latch unit 240 and generating a global row address gax<0:12>. The global address generator 260 is adapted to output the latched internal address at<0:11> from the address latch unit 240 as the global row address gax<0:12> when the detection result of the detector 230 indicates that the pre-latched internal address to_fuse<0:11> from the pre-latch unit 220 is the normal address, and an address obtained by encoding the detection signals fuse_out<0:5> as the global row address gax<0:12> when the detection result of the detector 230 indicates that the pre-latched internal address to_fuse<0:11> is the repaired address. The address path circuit according to the present embodiment further comprises a local address generator 280 for latching the global row address gax<0:12> synchronously with a row access strobe signal Ratvzp13 to output a local row address bax<0:12> which is valid for each bank, and a decoder 290 for decoding the local row address bax<0:12> to output a normal main word line signal mwlz corresponding to the normal address or a redundant main word line signal rmwlz corresponding to the repaired address.

The operation of the address path circuit with the above-stated configuration according to the present embodiment will hereinafter be described in detail with reference to FIGS. 2 to 6.

First, a clock buffer 205 buffers an external clock CLK to output the clock iCLK. The address buffer 210 buffers the external address an<0:11> to output the internal address add<0:11>. The command buffer 215 buffers the plurality of external commands RAS, CAS, WE and CS.

Then, the pre-latch unit 220 pre-latches the internal address add<0:11> from the address buffer 210 using the command RAS (referred to hereinafter as a row address strobe (RAS) signal RAS) buffered by the command buffer 215 to output the pre-latched internal address to_fuse<0:11>. This operation of the pre-latch unit 220 will hereinafter be described in detail with reference to FIG. 3.

The internal address add<0:11> inputted to the pre-latch unit 220 is delayed by a predetermined period by a delay 221 and the RAS signal RAS inputted to the pre-latch unit 220 is delayed by a predetermined period by a delay 222. Here, the delay 221 and delay 222 act to adjust a setup-hold time of the internal address add<0:11> by delaying the internal address add<0:11> and RAS signal RAS by the predetermined periods, respectively. Subsequently, a D flip-flip 223 latches the internal address add<0:11> from the delay 221 synchronously with an output signal from the delay 222 to output the pre-latched internal address to_fuse<0:11>. That is, the D flip-flip 223 latches the internal address add<0:11> delayed by the delay 221 synchronously with a rising edge of the RAS signal RAS delayed by the delay 222 to hold the delayed internal address add<0:11> until a next rising edge of the delayed RAS signal RAS.

Next, the detector 230 detects whether the pre-latched internal address to_fuse<0:11> from the pre-latch unit 220 is a repaired address or normal address and outputs one or more detection signals fuse_out<0:5> as a result of the detection, as will hereinafter be described in detail with reference to FIGS. 4A and 4B.

In the detector 230 of FIG. 4A, a decoder 231 decodes the pre-latched internal address to fuse<0:11> to output a plurality of decoded signals bax2<0:1>, bax34<0:3>, bax56<0:3>, bax78<0:3> and bax9AB<0:7>. Here. any decoding circuit that is generally used in a semiconductor device is applicable as the decoder 231. Thereafter, detection circuits <0> to <5> each detect, on the basis of the decoded signals bax2<0:1>, bax34<0:3>, bax56<0:3>, bax78<0:3> and bax9AB<0:7> from the decoder 231, whether the pre-latched internal address to_fuse<0:11> is a repaired address or normal address. It should be noted here that the number of detection circuits used in the detector corresponds to that of redundancy circuits installed in the semiconductor device, although it may be different according to different semiconductor devices. The operation of the detection circuits <0> to <5> will hereinafter be described in detail with reference to FIG. 4B, which shows the configuration of the detection circuit <0>. The remaining detection circuits <1> to <5> are the same in configuration as the detection circuit <0>.

First, when a precharge signal wlaz is enabled low in level, a PMOS transistor P10 is turned on, thereby causing a node A to be precharged to high in level. Then, the node A is held high in level by a latch 235 even though the precharge signal wlaz makes a low to high level transition to turn the PMOS transistor P10 off. When a bank active signal BA is enabled high in level, NMOS transistors N51 to N55 are turned on.

In FIG. 4B, a plurality of fuse circuits 232_1 to 232_5 include a plurality of fuses that are selectively cut to constitute a combination thereof corresponding to a redundant cell address. That is, only any one of the fuses of the fuse circuit 231_1 is cut. Similarly, only any one of the fuses of each of the fuse circuits 232_2 to 232_5 is cut. In this connection, provided that it is known what fuses in the respective fuse circuits have been cut, it will be possible to know a corresponding redundant cell address from the combination of those fuses.

For example, in the case where the combination of high-level ones of the decoded signals bax2<0:1>, bax34<0:3>, bax56<0:3>, bax78<0:3> and bax9AB<0:7> applied to the detection circuit <0> is the same as that of cut fuses, no current path is formed between the node A and a ground terminal VSS, so the node A remains at the precharge level, or high level. In other words, for example, in the case where only the decoded signals bax2<0>, bax34<0>, bax56<0>, bax78<0> and bax9AB<0> are high in level under the condition that only the fuses f11, f13, f17, f21 and f25 are cut and the remaining fuses are not cut, no current path is formed between the node A and the ground terminal VSS, thereby causing the node A to remain at the precharge level, or high level. As a result, the detection signal fuse out<0> assumes a high level to indicate that the inputted internal address is a repaired address.

On the other hand, in the case where the combination of high-level ones of the decoded signals bax2<0:1>, bax34<0:3>, bax56<0:3> bax78<0:3> and bax9AB<0:7> applied to the detection circuit <0> is not the same as that of cut fuses, at least one current path is formed between the node A and the ground terminal VSS, so the node A goes low in level. In other words, for example, in the case where at least one of the decoded signals bax2<0>, bax34<0>, bax56<0>, bax78<0> and bax9AB<0> are low in level under the condition that only the fuses f11, f13, f17, f21 and f25 are cut and the remaining fuses are not cut, at least one signal other than those signals becomes high in level and at least one of NMOS transistors connected to the fuses, not cut, is thus turned on, thereby causing at least one current path to be formed between the node A and the ground terminal VSS. As a result, the node A becomes low in level and the detection signal fuse_out<0> thus assumes a low level to indicate that the inputted internal address is a normal address, because it does not correspond to a redundant cell address.

This detection operation is performed in the detection circuits <1> to <5>, as well as in the detection circuit <0>. Consequently, if at least one of the detection signals fuse_out<0:5>, which are the output signals from the detection circuits <0> to <5>, assumes a high level, the internal address inputted to the semiconductor device is determined to be a repaired address.

Meanwhile, the address latch unit 240 latches the internal address add<0:11> from the address buffer 210 synchronously with the buffered clock iCLK. That is, the address buffer 240 outputs the internal address at<0:11> latched synchronously with the clock iCLK. A command decoder 250 receives at least one of the commands buffered by the command buffer 215 and outputs a row-decoded signal rowp6.

Then, the global address generator 260 receives the detection signals fuse_out<0:5>, the latched internal address at<0:

11> and the row-decoded signal rowp6 and generates the global row address gax<0:12>, which is to be sent over a global address line. The operation of the global address generator 260 will hereinafter be described in detail with reference to FIG. 5.

First, an address latch element 261 latches the internal address at<0:11> using the row-decoded signal rowp6. An encoder 262 encodes the detection signals fuse_out<0:5> to output an internal address corresponding to a redundant cell.

A logic circuit 262 performs an OR operation with respect to the detection signals fuse_out<0:5> to output a control signal to control a transfer gate TG11 and transfer gate TG12. At this time, if the internal address inputted to the semiconductor device is a repaired address, namely, if at least one of the detection signals fuse_out<0:5>, which are the output signals from the detection circuits <0> to <5>, is high in level, at least one of signals which are outputted from NOR gates NR11 to NR13 and then inputted to a NAND gate ND11 becomes low in level, thereby causing the output signal from the logic circuit 263 to assume a high level. In this case, because the transfer gate TG11 is turned off and the transfer gate TG12 is turned on, the internal address from the encoder 262 is outputted as the global row address gax<0:12> through a latch 264 and an inverter IV24.

In contrast, if the inputted internal address is a normal address, namely, if all of the detection signals fuse_out<0:5>, which are the output signals from the detection circuits <0> to <5>, are low in level, all of the signals which are outputted from the NOR gates NR11 to NR13 and then inputted to the NAND gate ND11 become high in level, thereby causing the output signal from the logic circuit 263 to assume a low level. In this case, because the transfer gate TG11 is turned on and the transfer gate TG12 is turned off, the internal address at<0:11> is outputted as the global row address gax<0:12>. Here, the global row address bit gax<12> of the global row address gax<0:12> indicates that the inputted address is a repaired address or normal address. For example, the global row address bit gax<12> indicates that the inputted address is a repaired address, if it is high in level, and a normal address if it is low in level.

Meanwhile, a control circuit 270 in FIG. 2 receives the row-decoded signal rowp6 and a bank address ba and outputs the row access strobe signal Ratvzp13, which is a kind of strobe signal. The local address generator 280 latches the global row address gax<0:12> from the global address generator 260 synchronously with the row access strobe signal Ratvzp13 from the control circuit 270 to output the local row address bax<0:12> which is valid for each bank.

Finally, the decoder decodes the local row address bax<0:12> to output the normal main word line signal mwlz corresponding to the normal address or the redundant main word line signal rmwlz corresponding to the repaired address, as will hereinafter be described in detail with reference to FIG. 6. The decoder 290 performs its decoding operation under the condition of detecting whether the internal address inputted to the semiconductor device is the repaired address or normal address, on the basis of the level of a local row address bit bax<12>. That is, if the inputted internal address is the normal address, a first decoder 291 is operated to output the normal main word line signal mwlz. However, if the inputted internal address is the repaired address, a second decoder 292 is operated to output the redundant main word line signal rmwlz.

As described above, in the address path circuit with the row redundant scheme according to the present embodiment, the detector, which detects whether an address inputted to the semiconductor device is a repaired address or normal address, is installed in a peri-area of the semiconductor device, not in each bank thereof. Therefore, according to this embodiment, it is possible to reduce the chip area of the semiconductor device and freely arrange fuse circuits in the detector. Further, even before detection information is generated by the detector, selection of a normal main word line can be made, thereby making it possible to improve the operating speed of the semiconductor device.

As apparent from the above description, an address path circuit wherein a detector, which detects whether an address inputted through an address buffer is a repaired address or normal address, is installed in a peri-area, not in each bank, thereby making it possible to reduce the chip area of a semiconductor device and improve the operating speed thereof.

Although the exemplary embodiments have been disclosed for illustrative purposes, those skilled in the art will appreciate that various modifications, additions and substitutions are possible, without departing from the scope and spirit of the invention as disclosed in the accompanying claims

What is claimed is:

1. An address path circuit with a row redundant scheme, comprising:
    an address buffer for buffering an external address to output an internal address;
    a command buffer for buffering a plurality of external commands;
    a pre-latch unit for pre-latching the internal address from the address buffer using a specific one of the commands buffered by the command buffer to output a pre-latched internal address;
    a detector for detecting whether the pre-latched internal address from the pre-latch unit is a repaired address or normal address and outputting one or more detection signals as a result of the detection;
    an address latch unit for latching the internal address from the address buffer synchronously with a buffered clock to output a latched internal address; and
    a global address generator for receiving the detection signals from the detector and the latched internal address from the address latch unit and generating a global row address, the global address generator outputting the latched internal address from the address latch unit as the global row address when the detection result of the detector indicates that the pre-latched internal address from the pre-latch unit is the normal address, and an encoded address obtained by encoding the detection signals as the global row address when the detection result of the detector indicates that the pre-latched internal address is the repaired address.

2. The address path circuit as set forth in claim 1, further comprising:
    a local address generator for latching the global row address synchronously with a row access strobe signal and outputting a local row address which is valid for each bank; and
    a decoder for decoding the local row address and outputting a normal main word line signal corresponding to the normal address or a redundant main word line signal corresponding to the repaired address.

3. The address path circuit as set forth in claim 2, wherein the decoder includes:
    a first decoder for decoding the local row address and outputting the normal main word line signal corresponding to the normal address; and
    a second decoder for decoding the local row address and outputting the redundant main word line signal corresponding to the repaired address.

4. The address path circuit as set forth in claim 1, wherein the pre-latch unit pre-latches the internal address from the address buffer using a row address strobe (RAS) signal buffered by the command buffer.

5. The address path circuit as set forth in claim 4, wherein the pre-latch unit includes:
- a first delay for delaying the internal address from the address buffer by a first period;
- a second delay for delaying the buffered RAS signal by a second period; and
- a latch element for latching an output signal from the first delay synchronously with a point of time that an output signal from the second delay is enabled.

6. The address path circuit as set forth in claim 5, wherein the latch element is a flip-flip, the flip-flop latching the output signal from the first delay synchronously with the point of time that the output signal from the second delay is enabled, and holding the output signal from the first delay until a next point of time that the output signal from the second delay is enabled.

7. The address path circuit as set forth in claim 1, wherein the detector includes:
- a decoder for decoding the pre-latched internal address from the pre-latch unit to output a plurality of decoded signals; and
- one or more detection circuits, each of the detection circuits detecting, on the basis of the decoded signals from the decoder, whether the pre-latched internal address is the repaired address or normal address.

8. The address path circuit as set forth in claim 7, wherein each of the detection circuits includes:
- a precharge for precharging a first node in response to a precharge signal;
- a plurality of pull-down devices for pulling the first node down in response to the decoded signals, respectively; and
- a plurality of fuses installed between the pull-down devices and the first node, respectively.

9. The address path circuit as set forth in claim 8, wherein each of the detection circuits further includes a latch for holding the first node at a desired voltage level.

10. The address path circuit as set forth in claim 8, wherein the fuses are selectively cut to constitute a combination thereof corresponding to a redundant cell address.

11. The address path circuit as set forth in claim 8, wherein each of the detection circuits further includes a plurality of switches installed between predefined groups of the pull-down devices and a ground terminal, respectively, the switches enabling a corresponding one of the detection circuits in response to a bank active signal.

12. The address path circuit as set forth in claim 1, wherein the global address generator includes:
- a logic circuit for performing a logic operation with respect to the detection signals from the detector;
- an encoder for encoding the detection signals from the detector to output the encoded address;
- a first signal transfer unit for transferring the latched internal address from the address latch unit in response to an output signal from the logic circuit; and
- a second signal transfer unit for transferring the encoded address from the encoder in response to the output signal from the logic circuit.

13. The address path circuit as set forth in claim 12, wherein the logic circuit outputs a gate control signal which is enabled when at least one of the detection signals is enabled.

14. The address path circuit as set forth in claim 13, wherein the logic circuit performs an OR operation.

15. The address path circuit as set forth in claim 14, wherein the logic circuit includes:
- a plurality of NOR gates, each of the NOR gates performing a NOR operation with respect to corresponding ones of the detection signals; and
- a NAND gate for performing a NAND operation with respect to output signals from the NOR gates.

16. The address path circuit as set forth in claim 12, wherein the global address generator further includes an address latch element for latching the latched internal address from the address latch unit and then supplying it to the first signal transfer unit.

17. The address path circuit as set forth in claim 12, wherein the first signal transfer unit and second signal transfer unit are transfer gates which are turned on/off in response to the output signal from the logic circuit.

18. The address path circuit as set forth in claim 12, wherein the global address generator further includes:
- a latch for latching an output signal from the first signal transfer unit or second signal transfer unit; and
- a buffer for buffering an output signal from the latch.

* * * * *